(12) United States Patent
Liu

(10) Patent No.: US 9,801,282 B2
(45) Date of Patent: Oct. 24, 2017

(54) PACKAGE STRUCTURE

(71) Applicant: IBIS Innotech Inc., Taichung (TW)

(72) Inventor: Wen-Chun Liu, Taichung (TW)

(73) Assignee: IBIS Innotech Inc., Taichung (TW)

( * ) Notice: Subject to any disclaimer, the term of this patent is extended or adjusted under 35 U.S.C. 154(b) by 0 days.

(21) Appl. No.: 15/232,808

(22) Filed: Aug. 10, 2016

(65) Prior Publication Data

US 2016/0353575 A1 Dec. 1, 2016

Related U.S. Application Data

(63) Continuation-in-part of application No. 14/663,447, filed on Mar. 19, 2015, now Pat. No. 9,451,694.

(51) Int. Cl.
*H05K 7/10* (2006.01)
*H05K 1/18* (2006.01)
(Continued)

(52) U.S. Cl.
CPC .......... *H05K 1/181* (2013.01); *H05K 1/0218* (2013.01); *H05K 1/0353* (2013.01); *H05K 1/0373* (2013.01); *H05K 1/115* (2013.01); *H05K 3/188* (2013.01); *H05K 3/4007* (2013.01); *H05K 1/113* (2013.01); *H05K 3/0014* (2013.01); *H05K 3/105* (2013.01); *H05K 3/4697* (2013.01); *H05K 2201/0236* (2013.01); *H05K 2201/0376* (2013.01); *H05K 2201/0919* (2013.01); *H05K 2201/09063* (2013.01); *H05K 2201/09118* (2013.01); *H05K 2201/10151* (2013.01); *H05K 2201/10515* (2013.01); *H05K 2201/10674* (2013.01)

(58) Field of Classification Search
USPC .................................. 361/767, 808; 174/557
See application file for complete search history.

(56) References Cited

U.S. PATENT DOCUMENTS 9,685,889 B2 * 6/2017 Horie ...................... H02N 2/001
2008/0073768 A1 * 3/2008 Shiraishi ................. B81B 7/007
257/684

(Continued)

OTHER PUBLICATIONS

Korczynski, "Wafer-level packaging of ICs for mobile systems of the future," Semiconductor Manufacturing & Designs Community, May 2014, pp. 1-5.

*Primary Examiner* — Andargie M Aychillhum
(74) *Attorney, Agent, or Firm* — JCIPRNET

(57) ABSTRACT

A package structure includes a substrate, a sensor, a base, a lead frame, conductive vias and patterned circuit layer. The substrate includes a component-disposing region and electrode contacts. The sensor is disposed at the component-disposing region and electrically connected to the electrode contacts. The base covers the substrate with its bonding surface and includes a receiving cavity, a slanted surface extended between a bottom surface of the receiving cavity and the bonding surface, and electrodes disposed on the bonding surface and electrically connected to the electrode contacts respectively. The sensor is located in the receiving cavity. The lead frame is disposed at the base. The conductive vias penetrates the base and electrically connected to the lead frame. The patterned circuit layer is disposed on the slanted surface and electrically connected to the conductive vias and the electrodes.

25 Claims, 10 Drawing Sheets

(51) Int. Cl.
*H05K 1/11* (2006.01)
*H05K 1/03* (2006.01)
*H05K 1/02* (2006.01)
*H05K 3/18* (2006.01)
*H05K 3/40* (2006.01)
H05K 3/00 (2006.01)
H05K 3/10 (2006.01)
H05K 3/46 (2006.01)

(56) References Cited

U.S. PATENT DOCUMENTS

2010/0127372 A1 5/2010 Holland
2012/0139090 A1 6/2012 Kim et al.

\* cited by examiner

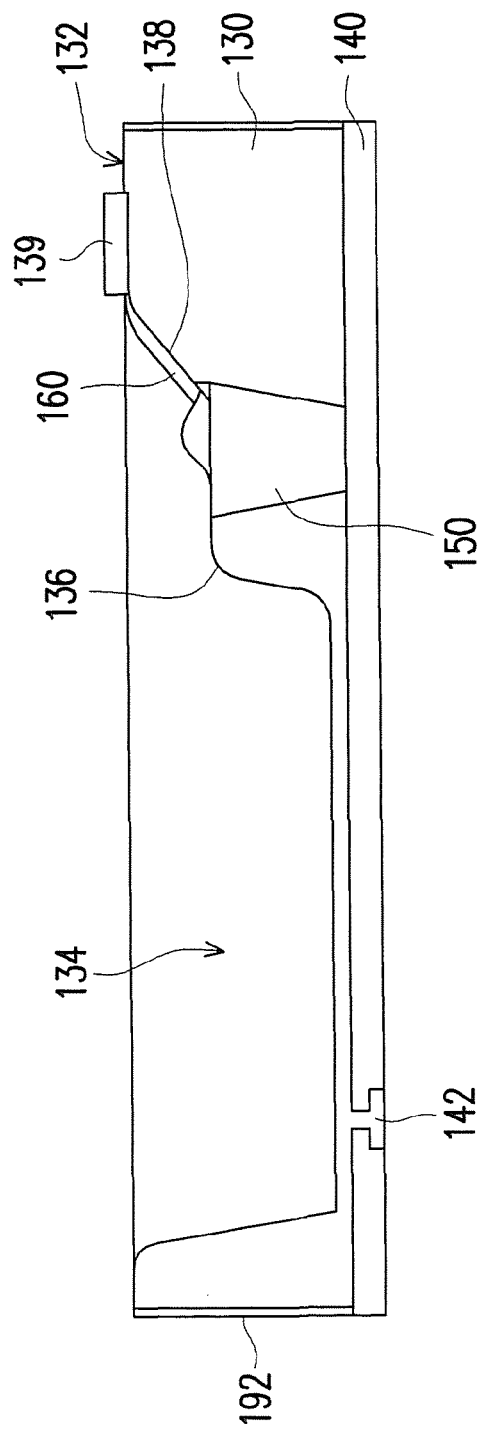
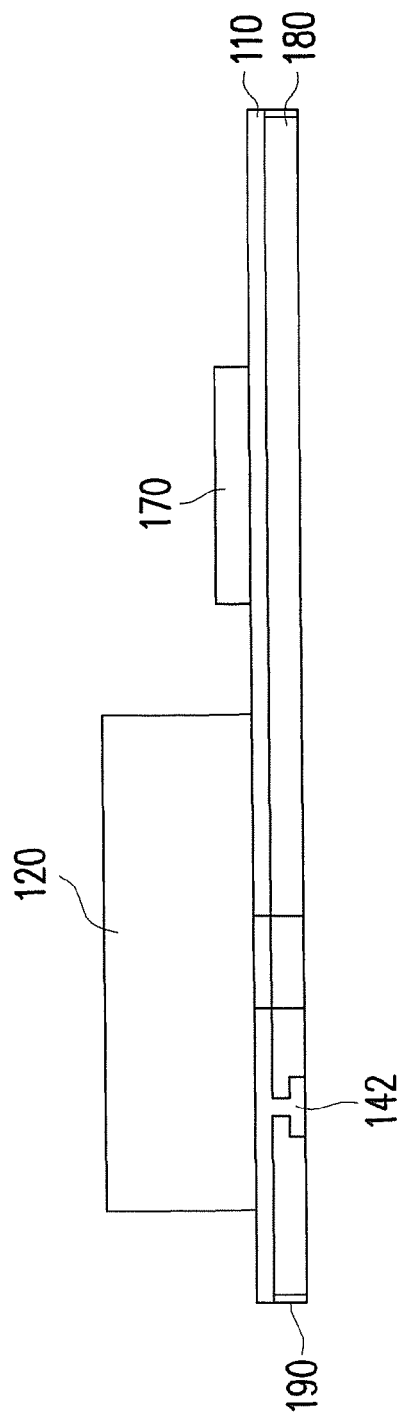
FIG. 4
FIG. 5

PACKAGE STRUCTURE

CROSS-REFERENCE TO RELATED APPLICATION

This is a continuation-in-part application of and claims the priority benefit of a prior application Ser. No. 14/663,447, filed on Mar. 19, 2015, now allowed, which claims the priority benefit of Taiwan patent application serial no. 103121829, filed on Jun. 24, 2014. The entirety of each of the above-mentioned patent applications is hereby incorporated by reference herein and made a part of this specification.

BACKGROUND OF THE INVENTION

Field of the Invention

The present invention generally relates to a package structure. More particularly, the present invention relates to a package structure of a sensing chip.

Description of Related Art

As technology advances, electronic products all develop towards the trends of lightweight and miniaturization. Taking microphones as an example, MEMS sensors have been widely applied in such field. Traditional microphone includes a MEMS sensor, a driving chip for driving the MEMS sensor and a circuit board for carrying the MEMS sensor and the driving chip. The circuit board, in addition to having a conductive layer and a dielectric layer, further has some conductive through vias, and the driving chip within the microphone is usually electrically connected with the conductive through vias.

In conventional technology, a sensor and a circuit board for carrying electronic components are manufactured separately. Then, the sensor is mounted on the circuit board to form a package structure of a sensing component. Such manufacturing process is not only complicated and time consuming, but also hard to reduce the overall thickness of the package structure of the sensing component. Therefore, how to improve the conventional sensing component package is currently one of the important problems desired to be solved by developers.

SUMMARY OF THE INVENTION

Accordingly, the present invention is directed to a package structure, which simplifies the manufacturing process thereof and reduces the overall thickness.

The present invention provides a package structure including a substrate, a sensing chip, a base, a first lead frame, a plurality of first conductive vias, a first patterned circuit layer, a second lead frame, a plurality of second conductive vias and a second patterned circuit layer. The substrate includes a component disposing region and a plurality of electrode contacts, wherein the electrode contacts are disposed at a side of the component disposing region. The sensing chip is disposed at the component disposing region and electrically connected to the electrode contacts. The base covers the substrate with a bonding surface and includes a receiving cavity, a slanted surface and a plurality of electrodes, wherein the slanted surface is connected between a bottom surface of the receiving cavity and the bonding surface, the electrodes are disposed on the bonding surface and electrically connected to the electrode contacts respectively, and the sensing chip are located in a corresponding area of the receiving cavity. The first lead frame is disposed at the base. The first conductive vias penetrate the base and electrically connected to the first lead frame. The first patterned circuit layer is disposed on the slanted surface and electrically connected to the first conductive vias and the electrodes. The second lead frame is disposed at the substrate. The second conductive vias penetrate the substrate and electrically connected to the second lead frame. The second patterned circuit layer is disposed on the substrate and electrically connected to the second conductive vias and the electrode contact.

According to an embodiment of the present invention, the base further includes a stepped portion protruding from the bottom surface of the receiving cavity. The slanted surface is extended from a top surface of the stepped portion to the bonding surface, and the first conductive vias penetrate the stepped portion to electrically connect the first lead frame.

According to an embodiment of the present invention, a materials of each of the base and the substrate includes selective-electroplating dielectric material, which comprises non-conductive metal complex.

According to an embodiment of the present invention, the selective-electroplating dielectric material includes epoxy, polyester, acrylate, fluorocarbon polymer, polyphenylene oxide, polyimide, phenolic resin, polysulfone, silicon polymer, bismaleimide-triazine (BT) modified epoxy resin, cyanate polyester, polyethylene, polycarbonate resin, acrylonitrile-butadiene-styrene (ABS) resin, polyethylene terephthalate (PET), polybutylene terephthalate (PBT), liquid crystal polyester, (LCP), polyamide, nylon 6, polyoxymethylene (POM), polyphenylene sulfide (PPS), cyclic-olefin copolymer (COC).

According to an embodiment of the present invention, a metal of the non-conductive metal complex includes zinc, copper, silver, gold, nickel, palladium, platinum, cobalt, rhodium, iridium, indium, iron, manganese, aluminum, chromium, wolfram, vanadium, tantalum, titanium, or any combination thereof.

According to an embodiment of the present invention, the package structure further includes a driving chip disposed on the substrate, wherein the driving chip is electrically connected to the sensing chip and the electrode contacts.

According to an embodiment of the present invention, the sensing chip includes a microelectromechanical systems (MEMS) sensing chip, and the driving chip comprises an application specific integrated circuit (ASIC).

According to an embodiment of the present invention, the substrate further includes a plurality of electrode openings, the electrode contacts are embedded in the electrode openings respectively, and a top surface of the electrode contacts is lower than a connecting surface of the substrate.

According to an embodiment of the present invention, the electrodes protrudes from the bonding surface of the base to be engaged with the electrode openings and in contact with the electrode contacts.

According to an embodiment of the present invention, the first lead frame includes a plurality of external pads electrically connected to the sensing chip, a back surface of the base exposes the external pads, and the back surface is opposite to the bonding surface of the base.

According to an embodiment of the present invention, the second lead frame covers a back surface of the substrate, wherein the back surface of the substrate faces away from the base.

According to an embodiment of the present invention, the package structure further includes a substrate grounding/shielding layer and a base grounding/shielding layer, wherein the substrate grounding/shielding layer covers a surrounding side surface of the substrate and connects the second lead frame, and the base grounding/shielding layer covers a surrounding side surface and/or an inner surface of the cavity of the base and connects the first lead frame.

According to an embodiment of the present invention, the second lead frame further includes a plurality of stepped vias penetrating into the second lead frame, the substrate further includes a plurality of stepped protrusions to be engaged with the stepped vias respectively. Each of the stepped vias includes a top lid portion and a connecting portion connecting the top lid portion, and a minimum diameter of the top lid portion is greater than a maximum diameter of the connecting portion.

According to an embodiment of the present invention, the first lead frame further includes a plurality of stepped vias penetrating into the first lead frame, the base further includes a plurality of stepped protrusions to be engaged with the stepped vias respectively. Each of the stepped vias includes a top lid portion and a connecting portion connecting the top lid portion, and a minimum diameter of the top lid portion is greater than a maximum diameter of the connecting portion.

According to an embodiment of the present invention, the second lead frame further includes a stop ring surrounding the through hole and keeping a distance from an outer rim of the through hole.

According to an embodiment of the present invention, the second lead frame comprises a plurality of external pads, which are electrically connected to the sensing chip.

According to an embodiment of the present invention, the package structure further includes a through hole penetrating the substrate and the second lead frame to expose a part of the sensing chip.

According to an embodiment of the present invention, the first lead frame is disposed at a back surface opposite to the bonding surface and covers the back surface of the base.

According to an embodiment of the present invention, the package structure further includes an adhesive, wherein the adhesive includes non-conductive adhesive or conductive adhesive, disposed between the bonding surface to adhere the base and the substrate to each other.

According to an embodiment of the present invention, a bottom surface of the first patterned circuit layer is lower than the slanted surface, and a bottom surface of the second patterned circuit layer is lower than a top surface of the substrate.

In light of the foregoing, the package structure of the disclosure utilizes the design of slanted surface to effectively extend the circuit to the bonding surface of the base and back surface opposite to the bonding surface, so as to improve the design flexibility of the circuit. Moreover, in the present disclosure, the material of the base and/or the substrate includes selective-electroplating dielectric material, so as to utilize the selectively electroplating characteristics thereof to form the conductive structures such as patterned circuit layers, conductive vias or electrodes by directly electroless plating and electroplating the surface of the base and/or the substrate. Moreover, the patterned circuit layer formed by such process can meet the fine-line requirement, and the design flexibility of the connecting circuits of the package structure can be further improved. Furthermore, selective-electroplating dielectric material can be moulded by injection moulding technique, such that the design flexibility of the thickness and the profile thereof can be improved. Accordingly, the thickness of the base/substrate can easily be reduced to under 100 µm. Therefore, the package structure of the disclosure not only improves the design flexibility, easily meets the fine-line requirement, but also effectively simplifies the manufacturing process and reduces the overall thickness of the package structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 illustrates a schematic cross-sectional view of a base according to an embodiment of the invention.

FIG. 5 illustrates a schematic cross-sectional view of a substrate according to an embodiment of the invention.

DESCRIPTION OF THE EMBODIMENTS

Figure 1A:
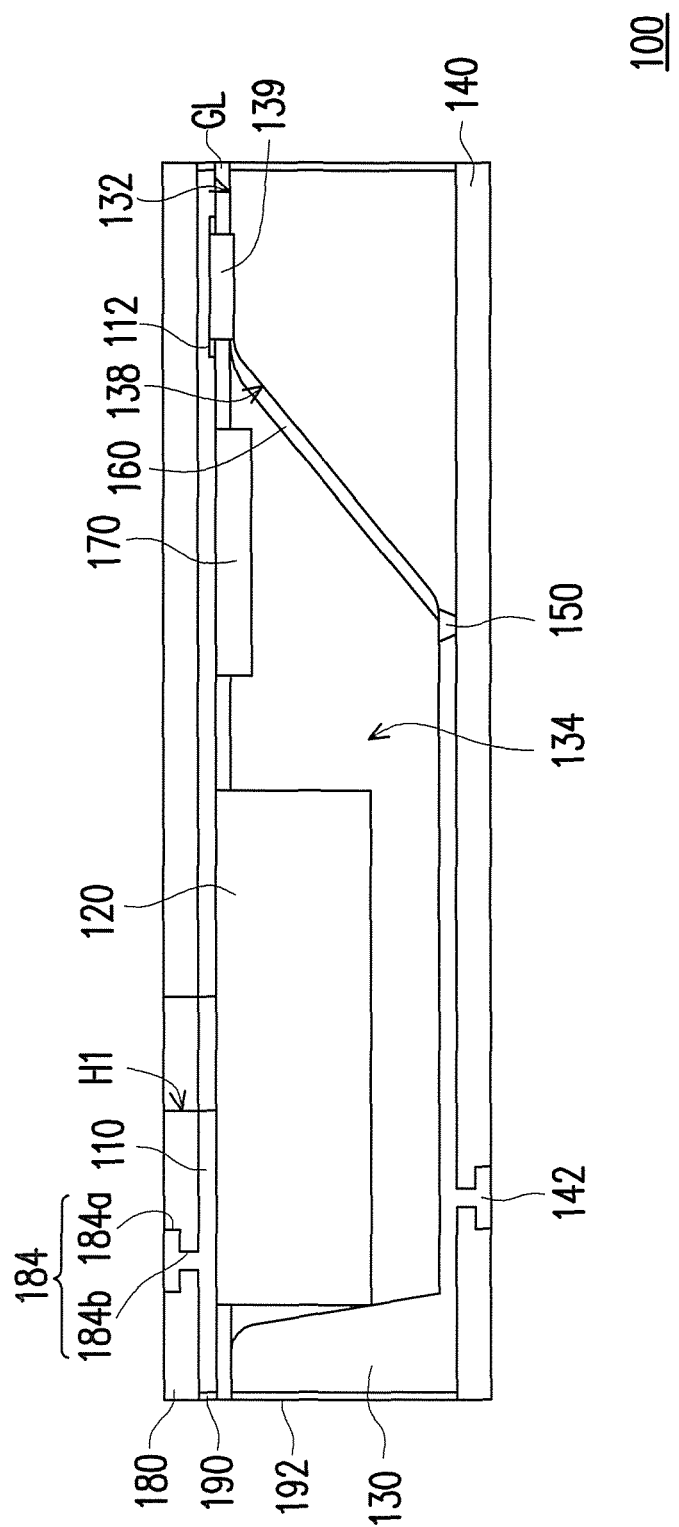
FIG. 1A illustrates a schematic cross-sectional view of a package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
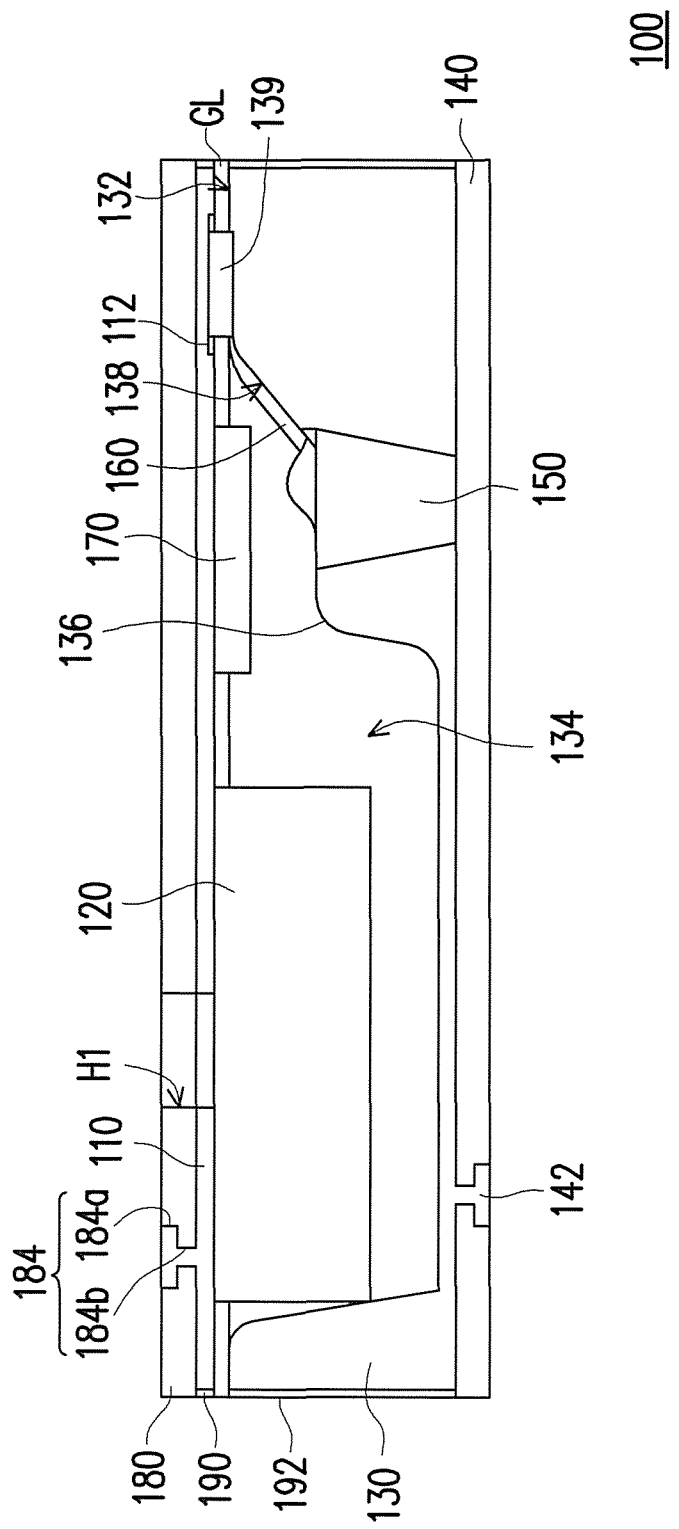
FIG. 1B illustrates a schematic cross-sectional view of a package structure according to another embodiment of the invention.
Figure 2:
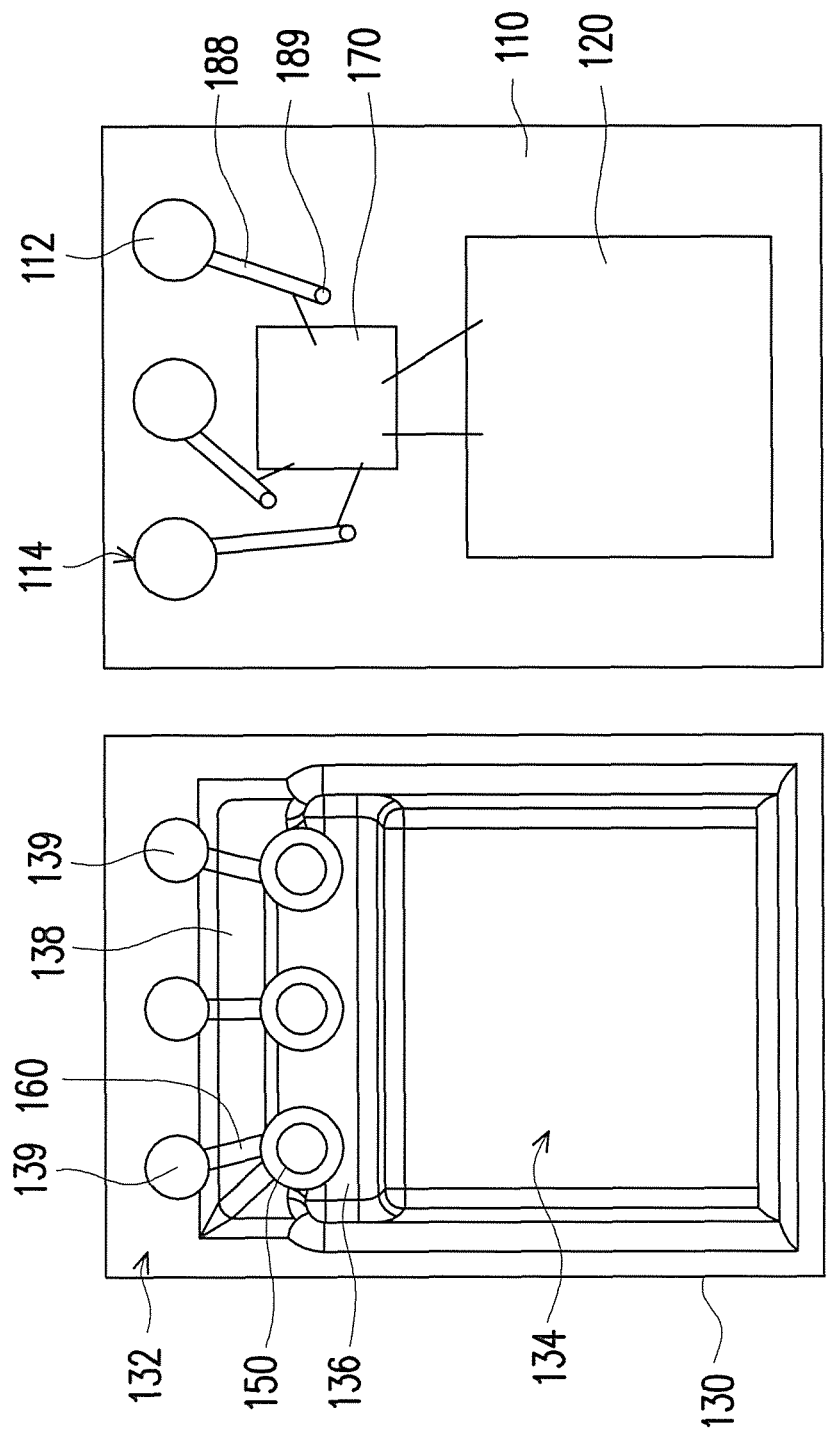
FIG. 2 illustrates a schematic top view of a base and a substrate of a package structure according to an embodiment of the invention.

FIG. 1A illustrates a schematic cross-sectional view of a package structure according to an embodiment of the invention. FIG. 1B illustrates a schematic cross-sectional view of a package structure according to another embodiment of the invention. FIG. 2 illustrates a schematic top view of a base and a substrate of a package structure according to an embodiment of the invention. Referring to FIG. 1A, FIG. 1B and FIG. 2, in the present embodiment, the package structure 100 includes a substrate 110, a sensing chi 120, a base 130, a first lead frame 140, a plurality of first conductive vias 150, a first patterned circuit layer 160, a second lead frame 180, a plurality of second conductive vias 189 and a second patterned circuit layer 188. The substrate 110 includes a component disposing region and a plurality of electrode contacts 112. The electrode contacts 112 are disposed at a side of the component disposing region as shown in FIG. 2. The sensing chip 120 is disposed at the component disposing region and electrically connected to the electrode contacts 112 and a driving chip 170. The second conductive vias 189 penetrate the substrate 110 and electrically connected to the second lead frame 180, and the second patterned circuit layer 188 is disposed on the substrate 110 and electrically connected to the second conductive vias 189 and the electrode contacts 112 as shown in FIG. 2. The base 130 covers the substrate 110 with a bonding surface 132 as shown in FIG. 1A and FIG. 1B, wherein the base 130 includes a receiving cavity 134, a slanted surface 138 and a plurality of electrodes 139. The slanted surface 138 is connected between a bottom surface of the receiving cavity 134 and the bonding surface 132 of the base 130 as shown in FIG. 1A. The first lead frame 140 is disposed at the base 130. The first conductive vias 150 penetrate the base 130 and is electrically connected to the first lead frame 140.

In one embodiment, the base 130 may further include a stepped portion 136 as shown in FIG. 1B, and the stepped portion 136 protrudes from the bottom surface of the receiving cavity 134. Moreover, the slanted surface 138 is extended from a top surface of the stepped portion 136 to the bonding surface 132 of the base 130. With such configuration, the first conductive vias 150 may penetrate the stepped portion 136 to electrically connect the first lead frame 140. It is noted that the stepped portion 136 of the embodiment is optionally disposed, and the invention is not limited thereto.

In the present embodiment, the electrodes 139 are disposed on the bonding surface 132 and electrically connected to the electrode contacts 112 of the substrate 110 respectively. The substrate 110 may include a plurality of electrode openings 114. The electrode contacts 112 are embedded in the electrode openings 114 respectively, and a top surface of the electrode contacts 112 is lower than a connecting surface of the substrate 110. Correspondingly, the electrodes 139 of the base 130 protrude from the bonding surface 132 to be engaged with the electrode openings 114 respectively and in contact with the electrode contacts 112 to form electrical connection with the electrode contacts 112. In the present embodiment, the sensing chip 120 may be disposed on the substrate 110 as shown in FIG. 1A and FIG. 1B and located in a corresponding area of the receiving cavity 134. The first lead frame 140 is disposed at the base 130, and the first conductive vias 150 penetrate the base 130 (or penetrate the stepped portion 136 as shown in FIG. 1B) to be electrically connected to the first lead frame 140. As such, the first patterned circuit layer 160 is disposed on the slanted surface 138 to be electrically connected to the first conductive vias 150 and the electrodes 139.

Figure 3:
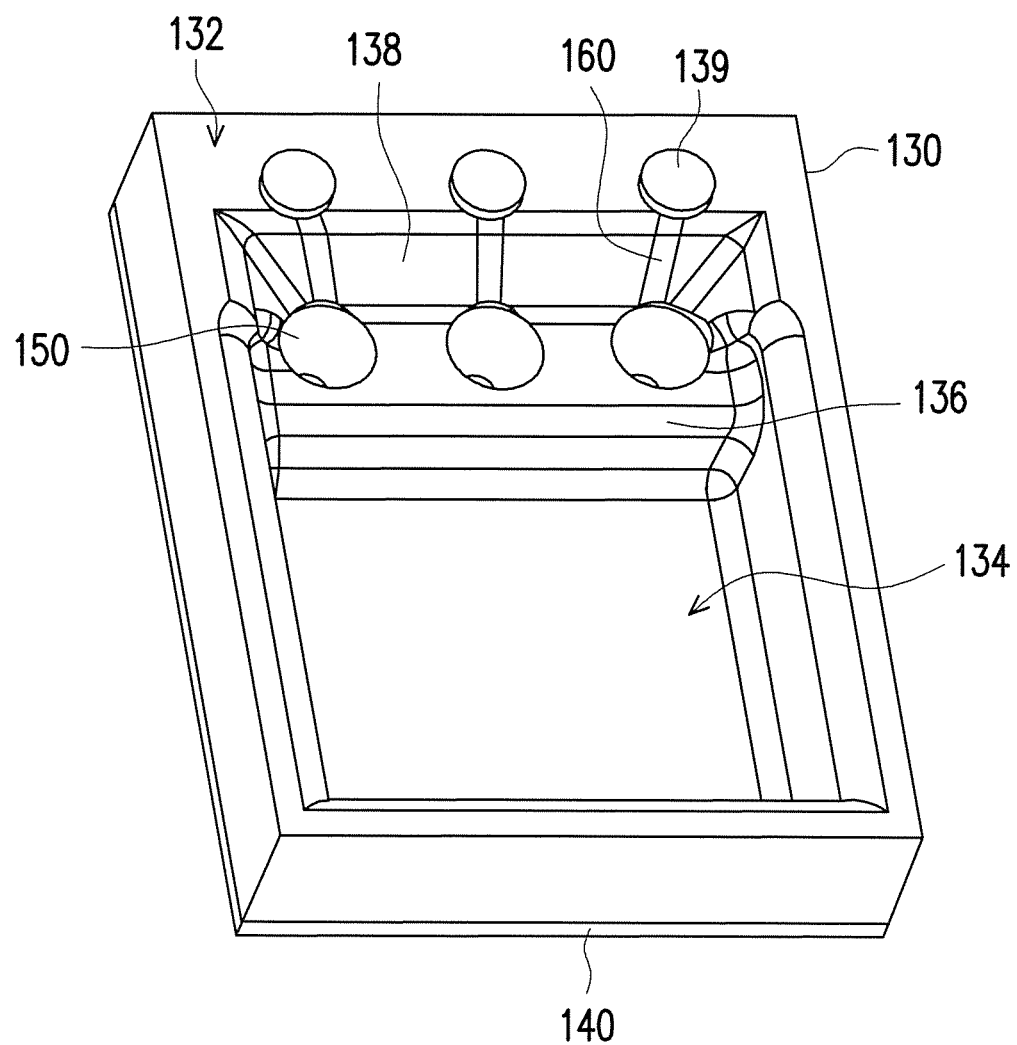
FIG. 3 illustrates a schematic view of a base according to an embodiment of the invention.
Figure 6:
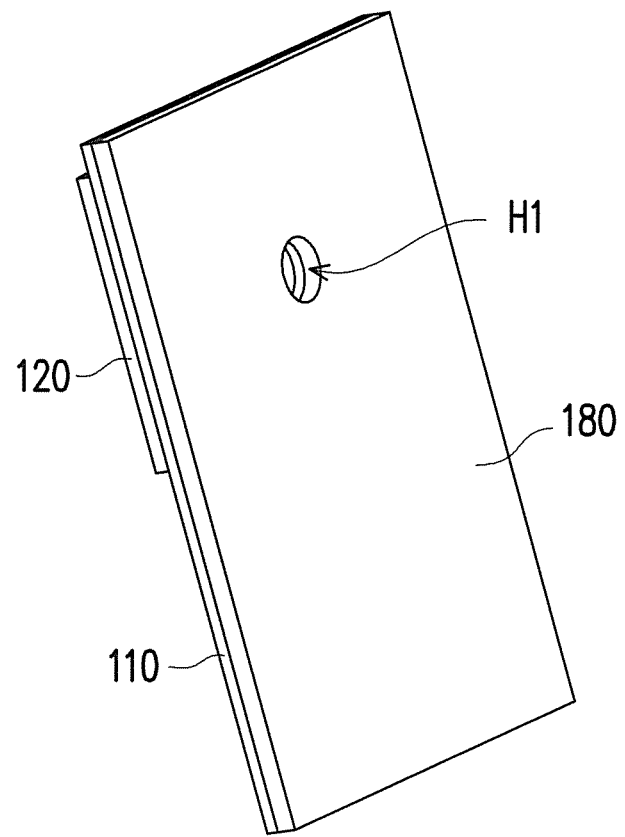
FIG. 6 illustrates a schematic view of a substrate according to an embodiment of the invention.

FIG. 3 illustrates a schematic view of a base according to an embodiment of the invention. FIG. 4 illustrates a schematic cross-sectional view of a base according to an embodiment of the invention. Referring to FIG. 3 and FIG. 4, in the present embodiment, the material of the base 130 and/or substrate 110 includes selective-electroplating dielectric material, which comprises non-conductive metal complex. Thereby, the package structure 100 of the present embodiment may utilize the selectively electroplating characteristics of the selective-electroplating dielectric material to form the first patterned circuit layer 160 as shown in FIG. 1A, FIG. 1B and FIG. 2 directly on the surface of the base 130 and/or substrate 110, and the first patterned circuit layer 160 is electrically connected to the electrodes 139 and the first conductive vias 150. In the present embodiment, the package structure 100 may further include an adhesive GL, which may be non-conductive adhesive or conductive adhesive, and be disposed between the bonding surface 132 and the base 110 to adhere the base 130 and the substrate 110 to each other.

Specifically, the selective-electroplating dielectric material may include epoxy, polyester, acrylate, fluorocarbon polymer, polyphenylene oxide, polyimide, phenolic resin, polysulfone, silicon polymer, bismaleimide-triazine (BT) modified epoxy resin, cyanate polyester, polyethylene, polycarbonate resin, acrylonitrile-butadiene-styrene (ABS) resin, polyethylene terephthalate (PET), polybutylene terephthalate (PBT), liquid crystal polyester, (LCP), polyamide, nylon 6, polyoxymethylene (POM), polyphenylene sulfide (PPS), cyclic-olefin copolymer (COC), etc. A metal of the non-conductive metal complex may include zinc, copper, silver, gold, nickel, palladium, platinum, cobalt, rhodium, iridium, indium, iron, manganese, aluminium, chromium, wolfram, vanadium, tantalum, titanium, or any combination thereof.

In detail, the method of performing selectively electroplating on the slanted surface 138 of the base 130 to form the first patterned circuit layer 160 may include the following steps. A circuit trench corresponding to the first patterned circuit layer 160 is carved on the slanted surface 138 of the base 130 along a path, where the first patterned circuit layer 160 is to be formed, by laser, such that the non-conductive metal complex located at the circuit trench is damaged to release heavy metal nuclei which is highly active in metal reduction. Then, selective-electroplating dielectric material is selective electroplated, so as to form the first patterned circuit layer 160 on the circuit trench by direct electroless plating and electroplating. Thus, the first patterned circuit layer 160 foil led by the process is embedded in the slanted surface 138 of the base 130, and the slanted surface 138 of the base 130 exposes a top surface of the first patterned circuit layer 160. Moreover, the circuit trench corresponding to the first patterned circuit layer 160 is carved directly on the slanted surface 138 of the base 130 by laser, and then the first patterned circuit layer 160 is formed on the circuit trench by direct electroless plating and electroplating. Therefore, the top surface of the first patterned circuit layer 160 may be lower than or coplanar with the slanted surface 138 of the base 130. In the present embodiment, a bottom surface of the first patterned circuit layer 160 is lower than the slanted surface 138. Similarly, a bottom surface of the second patterned circuit layer 188 is lower than a top surface of the substrate 110. Additionally, the top surfaces of all kinds of patterned circuit layers formed directly on the surface of the base 130 by such method are lower than or coplanar with the surface of the base 130. Certainly, the present embodiment is merely for illustration and is not limited thereto.

Moreover, the base 130 and/or the substrate 110 of the package structure 100 can be moulded by injection moulding technique, such that the thickness and the shape of the base 130 and/or the substrate 110 may be adjusted flexibly according to requirement of products. Therefore, the package structure 100 of the embodiment not only can simplify the manufacturing process, enhance design flexibility, but also can effectively reduce the maximum thickness of the package structure 100.

FIG. 5 illustrates a schematic cross-sectional view of a substrate according to an embodiment of the invention. FIG.

6 illustrates a schematic view of a substrate according to an embodiment of the invention. Referring to FIG. 1A, FIG. 1B, FIG. 5 and FIG. 6, in detail, the package structure 100 of the present embodiment may further include a driving chip 170, which is disposed on the substrate 110. In the present embodiment, the location of the driving chip 170 may be corresponding to the stepped portion 136, but the invention is not limited thereto. The driving chip 170 may be electrically connected to the sensing chip 120 and the electrode contacts 112 through, for example, a plurality of wires. To be more specific, in the present embodiment, the package structure 100 may be a microelectromechanical systems (MEMS) microphone package structure. As such, the sensing chip 120 may be a MEMS sensing chip, and the driving chip 170 may be an application specific integrated circuit (ASIC) for driving the MEMS sensing chip. The package structure 100 may further include a through hole H1, which penetrate the substrate 110 to expose a part of the sensing chip 120. In the present embodiment, the through hole H1 may be a sound hole for the MEMS microphone package structure. Certainly, the present embodiment is merely for illustration, and the present invention does not limit the application field of the package structure 100.

Figure 7:
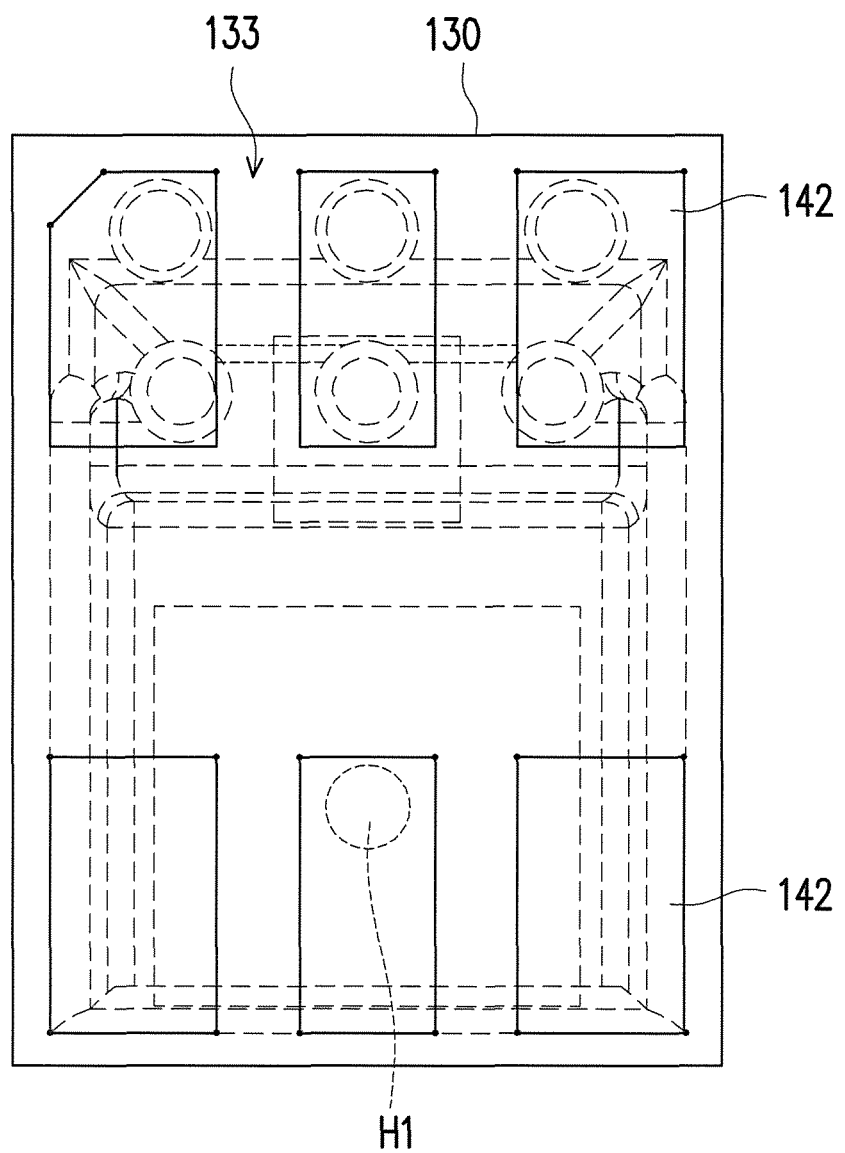
FIG. 7 illustrates a schematic bottom perspective view of a package structure according to an embodiment of the invention.

FIG. 7 illustrates a schematic bottom perspective view of a package structure according to an embodiment of the invention. Referring to FIG. 1A, FIG. 1B and FIG. 7, in the present embodiment, the first lead frame 140 may include a plurality of external pads 142 electrically connected to the sensing chip 120, and a back surface 133 of the base 130 exposes the external pads 142, wherein the back surface 133 is opposite to the bonding surface 132 of the base 130. As such, the package 100 as shown in FIG. 1A and FIG. 1B may be electrically connected to an external electronic component such as a mother board through the external pads 142 on the base 130.

In the present embodiment, the second lead frame 180 is disposed at the substrate 110 and may be a metal layer to at least mostly cover a back surface of the substrate 110, wherein the back surface of the substrate 220 faces away from the base 130. The through hole H1 penetrate the substrate 110 and the second lead frame 180 to expose a part of the sensing chip 120. In addition, in the present embodiment, the package structure 100 may further include a substrate grounding/shielding layer 190, which covers a surrounding side surface of the substrate 110 and connects the second lead frame 180 as shown in FIG. 1A and FIG. 1B. As such, during packaging and operating processes of the sensing chip 120, if static electricity is built up to certain degree that causes electrostatic discharge, the driving chip 170 is easily damaged by the electrostatic discharge due to the electrical connection between the driving chip 170 and the first conductive vias 150. Therefore, the second lead frame 180 and the substrate grounding/shielding layer 190 can function as a ground layer or an electromagnetic shielding layer to reduce effect of electrostatic discharge and electromagnetic interference. Moreover, the base 130 may also include a base grounding/shielding layer 192, which covers a surrounding side surface and/or an inner surface of the cavity 134 of the base 130 to achieve grounding and electromagnetic shielding effect.

Specifically, the manufacturing method of the substrate grounding/shielding layer 190 may be, for example, firstly forming the substrate 110 on the second lead frame 180 by injection moulding technique, then metalizing the non-conductive metal complex in the material of the substrate by laser, and then performing electroplating process to the substrate 110 to form the electrode contacts 112 and the substrate grounding/shielding layer 190 covering the surrounding side surface of the substrate 110. The base grounding/shielding layer 192 can be formed by similar manufacturing process described above.

In addition, to prevent the substrate 110 and the second lead frame 180 from de-lamination, the second lead frame 180 may further include a plurality of stepped vias 184 as shown in FIG. 1A and FIG. 1B. The stepped vias 184 penetrate the second lead frame 180, wherein each of the stepped vias 184 includes a top lid portion 184a and a connecting portion 184b connecting the top lid portion 184a, and a minimum diameter of the top lid portion 184a is greater than a maximum diameter of the connecting portion 184b. Correspondingly, the substrate 110 further includes a plurality of stepped protrusions to be engaged with the stepped vias 184 respectively. As such, the package structure 100 can enhance the bonding strength between the substrate 110 and the second lead frame 180 through the stepped vias 184, so as to reduce the issues of de-lamination.

Similarly, the first lead frame 140 may also include a plurality of stepped vias 142, wherein the structures thereof are the same as the stepped vias 184. Therefore, when the base 130 is formed on the first lead frame 140 by injection moulding technique, the base 130 can be filled in the stepped vias 142 to be engaged with the corresponding stepped vias 142. Thereby, the package structure 100 can enhance the bonding strength between the base 130 and the first lead frame 140 through the stepped vias 142, so as to reduce issues of de-lamination.

Figure 8:
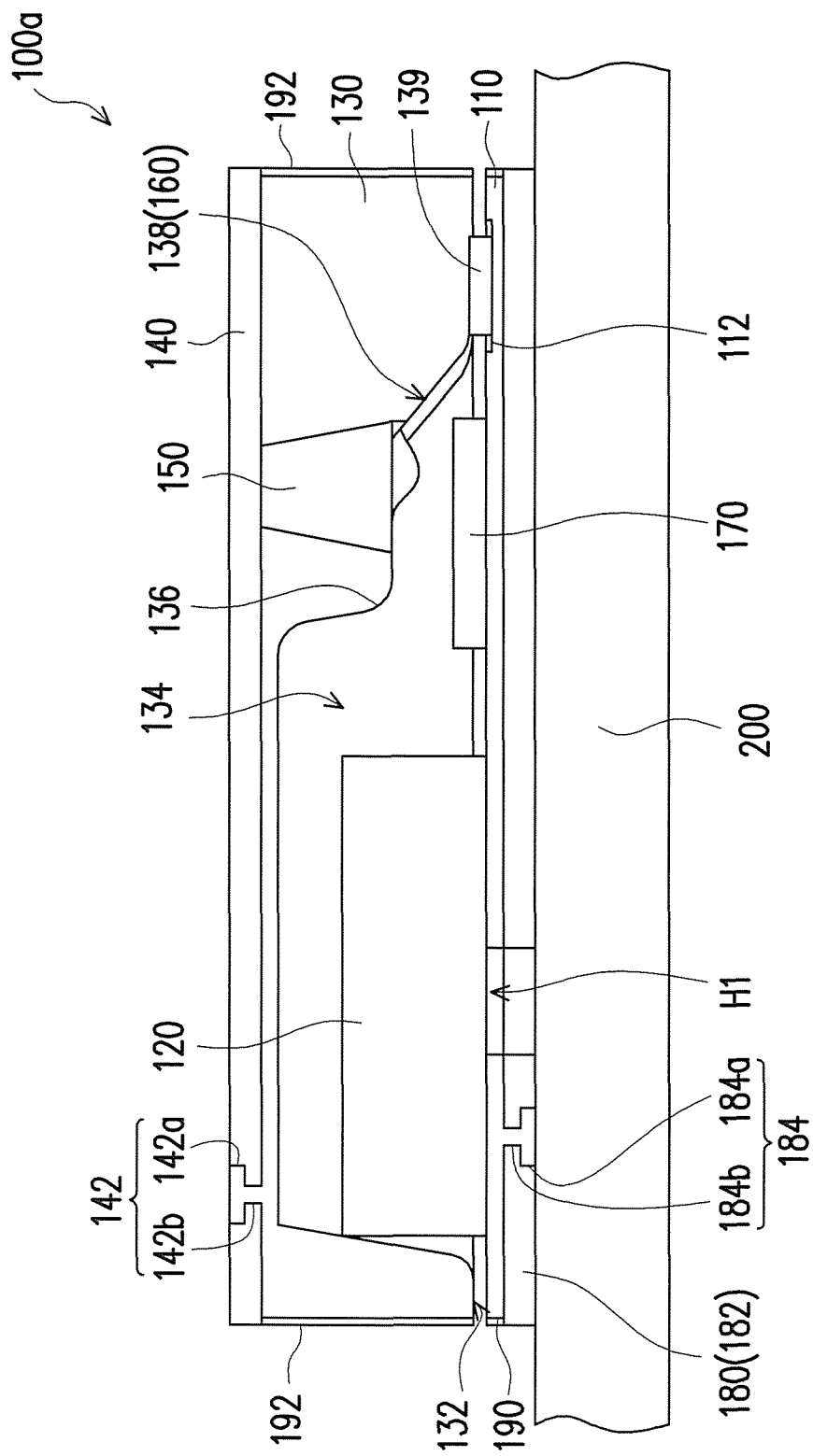
FIG. 8 illustrates a schematic cross-sectional view of a package structure according to an embodiment of the invention.

FIG. 8 illustrates a schematic cross-sectional view of a package structure according to an embodiment of the invention. It is noted that the package structure 100a of the present embodiment as shown in FIG. 8 contains many features same as or similar to the package structure 100 disclosed in previous embodiments. For purpose of clarity and simplicity, detail description of same or similar features may be omitted, and the same or similar reference numbers denote the same or like components. The main differences between the package structure 100a of the present embodiment and the package structure 100 of the previous embodiments are described as follows.

In the present embodiment, the package structure 100a further includes a second lead frame 180, which is disposed at the substrate 110 and includes a plurality of external pads 182, which are electrically connected to the sensing chip 120. Thereby, the package structure 100a may be electrically connected to an external electronic component, for example, a mother board, through the external pads 182 of the substrate 110 as shown in FIG. 8. With such configuration, the first lead frame 140 may be disposed at a back surface of the base 130, wherein the back surface is opposite to the bonding surface 132, and the first lead frame 140 may be a metal layer to at least mostly cover the back surface of the base 130. In addition, the package structure 100a may further include base grounding/shielding layer 192, which covers a surrounding side surface and/or an inner surface of the cavity 134 of the base 130 and connects the first lead frame 140. Accordingly, during packaging and operating processes of the sensing chip 120, if static electricity is built up to certain degree that causes electrostatic discharge, the driving chip 170 is easily damaged by the electrostatic discharge due to the electrical connection between the driving chip 170 and the first conductive vias 150. Therefore, the first lead frame 140 and the base grounding/shielding layer 192 can function as a ground layer or an electromagnetic shielding layer to reduce effect of electrostatic discharge and electromagnetic interference. Moreover, the substrate 110 may also include a substrate grounding/shielding layer 190, which covers a surrounding side surface of the substrate 110 to achieve grounding and electromagnetic shielding effect.

Specifically, the manufacturing method of the base grounding/shielding layer 192 may be, for example, firstly forming the base 130 on the first lead frame 140 by injection moulding technique, then metalizing the non-conductive metal complex in the material of the substrate by laser, and then performing electroplating process to the base 130 to form the electrodes 139, the first patterned circuit layer 160 and the base grounding/shielding layer 192 covering the surrounding side surface and/or an inner surface of the cavity 134 of the base 130. The substrate grounding/shielding layer 190 can be formed by similar manufacturing process described above.

In addition, to prevent the base 130 and the first lead frame 140 from de-lamination, the first lead frame 140 may further include a plurality of stepped vias 142 as shown in FIG. 1A and FIG. 1B. The stepped vias 142 penetrate into the first lead frame 140, wherein each of the stepped vias 142 includes a top lid portion 142a and a connecting portion 142b connecting the top lid portion 142a, and a minimum diameter of the top lid portion 142a is greater than a maximum diameter of the connecting portion 142b. Correspondingly, the base 130 further includes a plurality of stepped protrusions to be engaged with the stepped vias 142 respectively. As such, the package structure 100 can enhance the bonding strength between the base 130 and the first lead frame 140 through the stepped vias 142, so as to reduce the issues of de-lamination.

Similarly, the second lead frame 180 may also include a plurality of stepped vias 184, wherein the structures thereof are the same as the stepped vias 142. Therefore, when the substrate 110 is formed on the second lead frame 180 by injection moulding technique, the substrate 110 can be filled in the stepped vias 184 to be engaged with the corresponding stepped vias 184. Thereby, the package structure 100a can enhance the bonding strength between the substrate 110 and the second lead frame 180 through the stepped vias 184, so as to reduce the issues of de-lamination.

Figure 9:
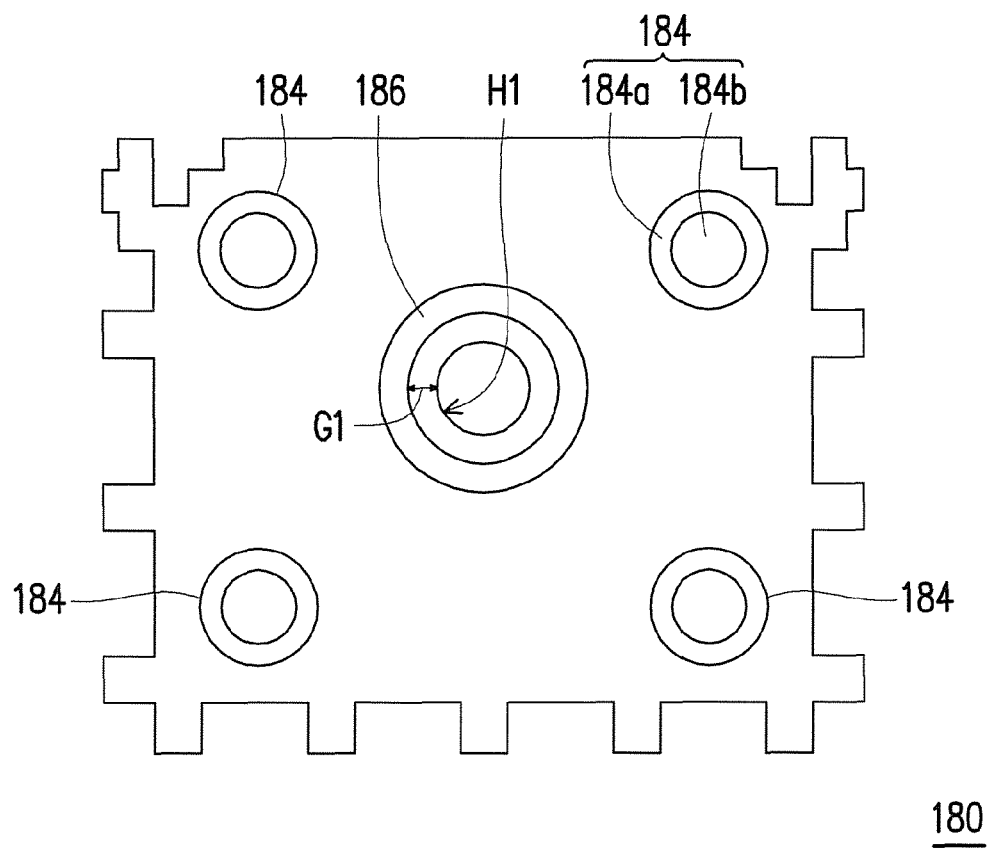
FIG. 9 illustrates a top view of a lead frame according to an embodiment of the invention.
Figure 10:
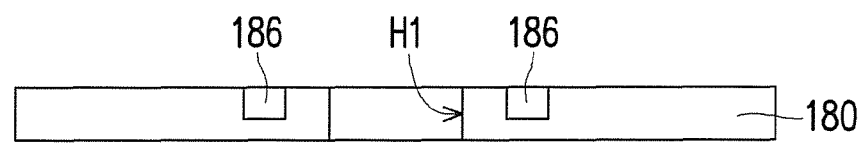
FIG. 10 illustrates a schematic cross-sectional view of the lead frame in FIG. 9 according to an embodiment of the invention.
Figure 11:
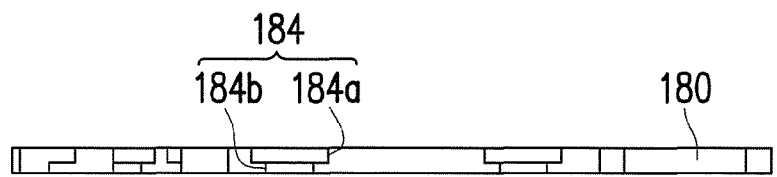
FIG. 11 illustrates another schematic cross-sectional view of the lead frame in FIG. 9 according to an embodiment of the invention.

FIG. 9 illustrates a top view of a lead frame according to an embodiment of the invention. FIG. 10 illustrates a schematic cross-sectional view of the lead frame in FIG. 9 according to an embodiment of the invention. FIG. 11 illustrates another schematic cross-sectional view of the lead frame in FIG. 9 according to an embodiment of the invention. Referring to FIG. 9 to FIG. 11, in detail, the second lead frame 180 of the present embodiment may include the stepped vias 184 and a stop ring 186 as shown in FIG. 9. The stop ring 186 surrounds the through hole H1 and keeps a distance G1 from an outer rim of the through hole H1. Thereby, with the disposition of the stop ring 186, the problem of moulding material overflow when the substrate 110 is formed on the second lead frame 180 by injection moulding technique can be prevented.

Figure 12:
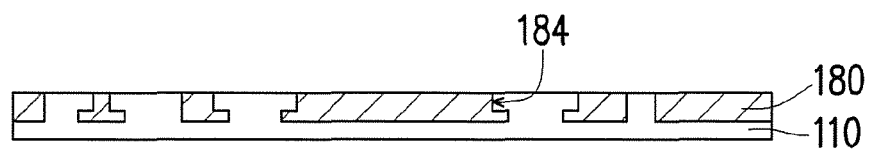
FIG. 12 illustrates a schematic cross-sectional view of the lead frame in FIG. 11 bonding with the substrate according to an embodiment of the invention.
Figure 13:
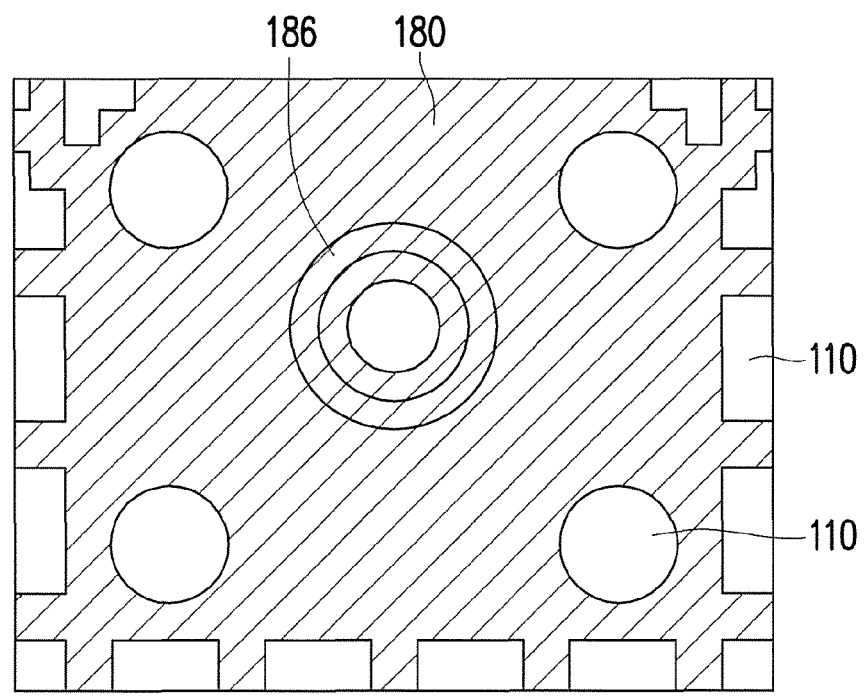
FIG. 13 illustrates a schematic top view of the lead frame in FIG. 12 bonding with the substrate according to an embodiment of the invention.

FIG. 12 illustrates a schematic cross-sectional view of the lead frame in FIG. 11 bonding with the substrate according to an embodiment of the invention. FIG. 13 illustrates a schematic top view of the lead frame in FIG. 12 bonding with the substrate according to an embodiment of the invention. It is noted that the lead frame region in FIG. 12 and FIG. 13 are marked with diagonal pattern to better distinguish the lead frame and the substrate. Referring to FIG. 12 and FIG. 13, in the present embodiment, the stepped vias 184 penetrate into the second lead frame 180, wherein each of the stepped vias 184 includes a top lid portion 184a and a connecting portion 184b connecting the top lid portion 184a, and a minimum diameter of the top lid portion 184a is greater than a maximum diameter of the connecting portion 184b. As such, when the moulding material is injected along the direction of the arrow illustrated in FIG. 12 to form the substrate 110 on the second lead frame 180, the moulding material is filled in the stepped vias 184 to form the substrate 110 engaged with the stepped vias 184 of the second lead frame 180, so as to enhance the bonding strength between the substrate 110 and the second lead frame 180 and reduce the issues of de-lamination.

In sum, the package structure of the disclosure utilizes the design of slanted surface to effectively extend the circuit to the bonding surface of the base and back surface opposite to the bonding surface, so as to improve the design flexibility of the circuit. Moreover, the slanted surface and the stepped portion can be configured to receive the driving chip of the package structure, so as to enhance the space utilization of the package structure. In addition, in the present disclosure, the material of the base and/or the substrate includes selective-electroplating dielectric material, so as to utilize the selectively electroplating characteristics thereof to form the conductive structures such as patterned circuit layers, conductive vias or electrodes by directly electroless plating and electroplating the surface of the base and/or the substrate. Furthermore, the patterned circuit layer formed by such process can meet the fine-line requirement, and the design flexibility of the connecting circuits of the package structure can be further improved. Furthermore, selective-electroplating dielectric material can be moulded by injection moulding technique, such that the design flexibility of the thickness and the profile thereof can be improved. Accordingly, the thickness of the base/substrate can easily be reduced to under 100 μm. Therefore, the package structure of the disclosure not only improves the design flexibility, easily meets the fine-line requirement, but also effectively simplifies the manufacturing process and reduces the overall thickness of the package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A package structure, comprising:
a substrate comprising a component disposing region and a plurality of electrode contacts, wherein the electrode contacts are disposed at a side of the component disposing region;
a sensing chip disposed at the component disposing region and electrically connected to the electrode contacts;
a base covering the substrate with a bonding surface and comprising a receiving cavity, a slanted surface and a plurality of electrodes, wherein the slanted surface is connected between a bottom surface of the receiving cavity and the bonding surface, the electrodes are disposed on the bonding surface and electrically connected to the electrode contacts respectively, and the sensing chip are located in a corresponding area of the receiving cavity;
a first lead frame disposed at the base; and
a plurality of first conductive vias penetrating the base and electrically connected to the first lead frame;

a first patterned circuit layer disposed on the slanted surface and electrically connected to the first conductive vias and the electrodes;

a second lead frame disposed at the substrate;

a plurality of second conductive vias penetrating the substrate and electrically connected to the second lead frame; and a second patterned circuit layer disposed on the substrate and electrically connected to the second conductive vias and the electrode contacts.

2. The package structure as claimed in claim 1, wherein the base further comprises a stepped portion protruding from the bottom surface of the receiving cavity, the slanted surface is extended from a top surface of the stepped portion to the bonding surface, and the first conductive vias penetrate the stepped portion to electrically connect the first lead frame.

3. The package structure as claimed in claim 1, wherein the materials of each of the base and the substrate comprises selective-electroplating dielectric material, which comprises non-conductive metal complex.

4. The package structure as claimed in claim 3, wherein the selective-electroplating dielectric material comprises epoxy, polyester, acrylate, fluorocarbon polymer, polyphenylene oxide, polyimide, phenolic resin, polysulfone, silicon polymer, bismaleimide-triazine (BT) modified epoxy resin, cyanate polyester, polyethylene, polycarbonate resin, acrylonitrile-butadiene-styrene (ABS) resin, polyethylene terephthalate (PET), polybutylene terephthalate (PBT), liquid crystal polyester, (LCP), polyamide, nylon 6, polyoxymethylene (POM), polyphenylene sulfide (PPS), cyclic-olefin copolymer (COC).

5. The package structure as claimed in claim 3, wherein a metal of the non-conductive metal complex comprises zinc, copper, silver, gold, nickel, palladium, platinum, cobalt, rhodium, iridium, indium, iron, manganese, aluminum, chromium, wolfram, vanadium, tantalum, titanium, or any combination thereof.

6. The package structure as claimed in claim 1, further comprising a driving chip disposed on the substrate, wherein the driving chip is electrically connected to the sensing chip and the electrode contacts.

7. The package structure as claimed in claim 6, wherein the sensing chip comprises a microelectromechanical systems (MEMS) sensing chip, and the driving chip comprises an application specific integrated circuit (ASIC).

8. The package structure as claimed in claim 1, wherein the substrate further comprises a plurality of electrode openings, the electrode contacts are embedded in the electrode openings respectively, and a top surface of the electrode contacts is lower than a connecting surface of the substrate.

9. The package structure as claimed in claim 8, wherein the electrodes protrudes from the bonding surface of the base to be engaged with the electrode openings and in contact with the electrode contacts.

10. The package structure as claimed in claim 1, wherein the first lead frame comprises a plurality of external pads electrically connected to the sensing chip, a back surface of the base exposes the external pads, and the back surface is opposite to the bonding surface of the base.

11. The package structure as claimed in claim 10, wherein the second lead frame covers a back surface of the substrate, wherein the back surface of the substrate faces away from the base.

12. The package structure as claimed in claim 11, further comprising a substrate grounding/shielding layer and a base grounding/shielding layer, wherein the substrate grounding/shielding layer covers a surrounding side surface of the substrate and connects the second lead frame, and the base grounding/shielding layer covers a surrounding side surface and/or an inner surface of the cavity of the base and connects the first lead frame.

13. The package structure as claimed in claim 11, wherein the second lead frame further comprises a plurality of stepped vias penetrating the second lead frame, the substrate further comprises a plurality of stepped protrusions to be engaged with the stepped vias respectively, each of the stepped vias comprises a top lid portion and a connecting portion connecting the top lid portion, and a minimum diameter of the top lid portion is greater than a maximum diameter of the connecting portion.

14. The package structure as claimed in claim 11, wherein the first lead frame further comprises a plurality of stepped vias penetrating into the first lead frame, the base further comprises a plurality of stepped protrusions to be engaged with the stepped vias respectively, each of the stepped vias comprises a top lid portion and a connecting portion connecting the top lid portion, and a minimum diameter of the top lid portion is greater than a maximum diameter of the connecting portion.

15. The package structure as claimed in claim 11, further comprising a through hole penetrating the substrate and the second lead frame to expose a part of the sensing chip.

16. The package structure as claimed in claim 15, wherein the second lead frame further comprises a stop ring surrounding the through hole and keeping a distance from an outer rim of the through hole.

17. The package structure as claimed in claim 1, wherein the second lead frame comprises a plurality of external pads, which are electrically connected to the sensing chip.

18. The package structure as claimed in claim 17, further comprising a through hole penetrating the substrate and the second lead frame to expose a part of the sensing chip.

19. The package structure as claimed in claim 18, wherein the second lead frame further comprises a stop ring surrounding the through hole and keeping a distance from an outer rim of the through hole.

20. The package structure as claimed in claim 17, wherein the first lead frame is disposed at a back surface opposite to the bonding surface and covers the back surface of the base.

21. The package structure as claimed in claim 20, further comprising a substrate grounding/shielding layer and a base grounding/shielding layer, the substrate grounding/shielding layer covers a surrounding side surface of the substrate and connects the second lead frame, the base grounding/shielding layer covers a surrounding side surface and/or an inner surface of cavity of the base and connects the first lead frame.

22. The package structure as claimed in claim 20, wherein the first lead frame further comprises a plurality of stepped vias penetrating into the first lead frame, the base further comprises a plurality of stepped protrusions to be engaged with the stepped vias respectively, each of the stepped vias comprises a top lid portion and a connecting portion connecting the top lid portion, and a minimum diameter of the top lid portion is greater than a maximum diameter of the connecting portion.

23. The package structure as claimed in claim 17, wherein the second lead frame further comprises a plurality of stepped vias penetrating into the second lead frame, the substrate further comprises a plurality of stepped protrusions to be engaged with the stepped vias respectively, each of the stepped vias comprises a top lid portion and a connecting portion connecting the top lid portion, and a minimum diameter of the top lid portion is greater than a maximum diameter of the connecting portion.

24. The package structure as claimed in claim 1, further comprising an adhesive, wherein the adhesive comprises non-conductive adhesive or conductive adhesive, disposed between the bonding surface to adhere the base and the substrate to each other.

25. The package structure as claimed in claim 1, wherein a bottom surface of the first patterned circuit layer is lower than the slanted surface, and a bottom surface of the second patterned circuit layer is lower than a top surface of the substrate.

\* \* \* \* \*